United States Patent
Oshita

(10) Patent No.: US 11,245,385 B2
(45) Date of Patent: Feb. 8, 2022

(54) FILTER DEVICE AND RADIO FREQUENCY MODULE

(71) Applicant: Murata Manufacturing Co., Ltd., Kyoto (JP)

(72) Inventor: Teruaki Oshita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 18 days.

(21) Appl. No.: 16/456,002

(22) Filed: Jun. 28, 2019

(65) Prior Publication Data

US 2020/0052677 A1  Feb. 13, 2020

(30) Foreign Application Priority Data

Aug. 9, 2018  (JP) .............................. JP2018-150430

(51) Int. Cl.
| | |
|---|---|
| *H03H 9/70* | (2006.01) |
| *H03H 9/72* | (2006.01) |
| *H03H 9/05* | (2006.01) |
| *H04B 1/00* | (2006.01) |
| *H04L 5/14* | (2006.01) |
| *H03H 7/38* | (2006.01) |

(52) U.S. Cl.
CPC ................ *H03H 9/70* (2013.01); *H03H 7/38* (2013.01); *H03H 9/0576* (2013.01); *H03H 9/725* (2013.01); *H04B 1/006* (2013.01); *H04L 5/14* (2013.01)

(58) Field of Classification Search
CPC ........................... H04L 5/14; H03H 9/70–725
See application file for complete search history.

(56) References Cited

U.S. PATENT DOCUMENTS

| | | | | |
|---|---|---|---|---|
| 10,243,539 | B2* | 3/2019 | Costa ....................... | H03H 7/38 |
| 10,396,749 | B2* | 8/2019 | Takeuchi ................. | H04B 1/50 |
| 10,454,516 | B2* | 10/2019 | Guyette .................. | H04B 1/525 |
| 10,547,287 | B2* | 1/2020 | Kim ......................... | H03H 9/54 |
| 10,715,112 | B2* | 7/2020 | Nosaka ................ | H03H 9/6483 |
| 2014/0321339 | A1 | 10/2014 | Pehlke | |
| 2014/0355497 | A1* | 12/2014 | Reiha ....................... | H01Q 5/10 |
| | | | | 370/281 |
| 2020/0028491 | A1* | 1/2020 | Kuroyanagi ......... | H03H 9/6489 |

* cited by examiner

*Primary Examiner* — Dean O Takaoka
*Assistant Examiner* — Alan Wong
(74) *Attorney, Agent, or Firm* — Pearne & Gordon LLP

(57) ABSTRACT

A duplexer included in a radio frequency module is used in a communication band in which the transmit band in a single communication band includes a first transmit band and a second transmit band overlapping each other and in which the receive band in the single communication band includes a first receive band and a second receive band overlapping each other. A transmit filter unit in the duplexer uses, as a pass band, a fixed frequency band including the first transmit band and the second transmit band. A receive filter unit of the duplexer uses, as a pass band, a fixed frequency band including the first receive band and the second receive band.

16 Claims, 8 Drawing Sheets

FILTER DEVICE AND RADIO FREQUENCY MODULE

This application claims priority from Japanese Patent Application No. 2018-150430 filed on Aug. 9, 2018. The content of this application is incorporated herein by reference in its entirety.

BACKGROUND

The present disclosure relates to a filter device and a radio frequency module for communication signals. The filter device and the radio frequency module are included in a communication device used in a mobile communication system.

There is the single communication band 28 in the Long Term Evolution (LTE) band defined by Third Generation Partnership Project (3GPP) which is a project aiming to define standard specifications about third-generation cellular phones. Band 28 is implemented as Band 28A and Band 28B. Band 28A is formed of a transmit (uplink) frequency band having a transmit band from 703 MHz to 733 MHz and a receive (downlink) frequency band from 758 MHz to 788 MHz. Band 28B is formed of a transmit (uplink) frequency band having a transmit band from 718 MHz to 748 MHz and a receive (downlink) frequency band from 773 MHz to 803 MHz.

FIG. 16 is a diagram illustrating the frequency bands of Band 28. In FIG. 16, B28Tx indicates the transmit frequency band of Band 28. B28Rx indicates the receive frequency band of Band 28. B28ATx indicates the transmit frequency band of Band 28A. B28BTx indicates the transmit frequency band of Band 28B. B28ARx indicates the receive frequency band of Band 28A. B28BRx indicates the receive frequency band of Band 28B. Thus, the transmit frequency band of Band 28A overlaps the transmit frequency band of Band 28B. The receive frequency band of Band 28A overlaps the receive frequency band of Band 28B.

In U.S. Patent Application Publication No. 2014/0321339, duplexers dedicated to the respective bands of Band 28A and Band 28B are included due to challenges associated with bandwidth and duplex gap.

FIG. 17 illustrates the configuration of a filter device, which is described in U.S. Patent Application Publication No. 2014/0321339, for transmit/receive signals of Band 28. A filter device 130 illustrated in FIG. 17 includes a power amplifier 142, a switch 146, duplexers 150 and 162, and an antenna switch 190. In FIG. 17, the names of the frequency bands described above are used as signal names. That is, a signal B28ATx indicates a transmit signal in Band 28A; a signal B28BTx indicates a transmit signal in Band 28B; a signal B28ARx indicates a receive signal in Band 28A; a signal B28BRx indicates a receive signal in Band 28B. The power amplifier 142 amplifies a transmit signal in Band 28A or a transmit signal in Band 28B. The switch 146 outputs an output signal from the power amplifier 142 selectively to one of the duplexers 150 and 162. The duplexer 150 performs frequency selection on a transmit signal and a receive signal in Band 28A. The duplexer 162 performs frequency selection on a transmit signal and a receive signal in Band 28B. The antenna switch 190 selects one of input/output signals from the duplexers 150 and 162 and connects the selected one to an antenna 196.

As described above, a filter device of the related art, which handles bands having overlapping transmit frequency bands, includes the following individual filters: a filter which handles a transmit signal in one of the overlapping bands; and a filter which handles a transmit signal in the other band. Similarly, a filter device of the related art, which handles bands having overlapping receive frequency bands, includes the following individual filters: a filter which handles a receive signal in one of the overlapping bands; and a filter which handles a receive signal in the other band. Therefore, the entire configuration of the filter device is complicated.

BRIEF SUMMARY

Accordingly, the present disclosure provides a filter device having a simple configuration and a radio frequency module including the filter device. The filter device and the radio frequency module are used in a single communication band having a first communication band and a second communication band which overlap each other.

A filter device serving as an example of the present disclosure is used in a single communication band having a first communication band and a second communication band. The first communication band and the second communication band overlap each other in the single communication band. The filter device includes a single input unit and a single output unit. The filter device uses, as a pass band, a fixed frequency band including the first communication band and the second communication band.

For example, Band 71, which is a single communication band defined in 3GPP, includes a first transmit band (71ATx) and a second transmit band (71BTx). The first transmit band (71ATx) and the second transmit band (71BTx) have an overlapping relationship with each other. The filter device is used in a transmit band having such a relationship. The filter device uses, as a pass band, a fixed frequency band including the first transmit band (71ATx) and the second transmit band (71BTx).

For example, Band 71 includes a first receive band (71ARx) and a second receive band (71BRx). The first receive band (71ARx) and the second receive band (71BRx) have an overlapping relationship with each other. The filter device is used in a receive band having such a relationship. The filter device uses, as a pass band, a fixed frequency band including the first receive band (71ARx) and the second receive band (71BRx).

According to the filter device, it is not necessary to individually include a filter, which handles a communication signal in one of overlapping bands, and a filter, which handles a communication signal in the other band, achieving a filter device having a simple configuration and a radio frequency module including the filter device.

A filter device serving as an example of the present disclosure is used in a single communication band in which a transmit band in the single communication band includes a first transmit band and a second transmit band and in which a receive band in the single communication band includes a first receive band and a second receive band. The first transmit band and the second transmit band overlap each other. The first receive band and the second receive band overlap each other. The filter device includes an input/output unit, a transmit-signal input unit, a receive-signal output unit, a transmit filter unit, and a receive filter unit. The transmit filter unit is disposed between the transmit-signal input unit and the input/output unit. The transmit filter unit uses, as a pass band, a fixed frequency band including the first transmit band and the second transmit band. The receive filter unit is disposed between the receive-signal output unit and the input/output unit. The receive filter unit uses, as a pass band, a fixed frequency band including the first receive band and the second receive band.

For example, the transmit filter unit, which is a duplexer or a multiplexer used in the communication band of Band 71 described above, is disposed between a terminal that receives transmit signals in the transmit bands (71ATx and 71BTx) and an input/output terminal from which the transmit signals are output. The transmit filter unit uses, as a pass band, a fixed frequency band including the first transmit band (71ATx) and the second transmit band (71BTx). The receive filter unit is disposed between a terminal from which receive signals in the receive bands (71ARx and 71BRx) are output and the input/output terminal, and uses, as a pass band, a fixed frequency band including the first receive band (71ARx) and the second receive band (71BRx).

According to the filter device described above, it is not necessary to individually include a duplexer or a multiplexer, which handles a transmit signal and a receive signal in one of the overlapping bands, and a duplexer or a multiplexer, which handles a transmit signal and a receive signal in the other band, achieving a filter device having a simple configuration and a radio frequency module including the filter device.

The present disclosure provides a filter device having a simple configuration and a radio frequency module including the filter device. The filter device and the radio frequency module are used in a single communication band including a first communication band and a second communication band which overlap each other in the single communication band.

Other features, elements, characteristics and advantages of the present disclosure will become more apparent from the following detailed description of embodiments of the present disclosure with reference to the attached drawings.

DETAILED DESCRIPTION

Figure 1:
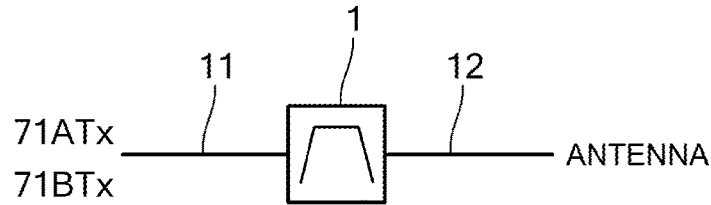
FIG. 1 is a circuit diagram of a transmit filter according to a first embodiment.

Some aspects of a filter device and a radio frequency module according to embodiments of the present disclosure will be described.

A filter device according to a first aspect of the present disclosure is used in a single communication band having a first communication band and a second communication band. The first communication band and the second communication band overlap each other in the single communication band. The filter device includes a single input unit and a single output unit. The filter device uses, as a pass band, a fixed frequency band including the first communication band and the second communication band.

According to the configuration described above, it is not necessary to individually include a filter, which handles communication signals in one of overlapping bands, and a filter, which handles communication signals in the other band, achieving simplification of the configuration.

According to a filter device of a second aspect of the present disclosure, the single communication band is a communication band defined in a 3GPP standard. The first communication band and the second communication band are communication bands defined in the 3GPP standard.

According to a filter device of a third aspect of the present disclosure, the first communication band is Band 28A in the 3GPP standard. The second communication band is Band 28B in the 3GPP standard.

According to a filter device of a fourth aspect of the present disclosure, the first communication band is Band 71A in the 3GPP standard. The second communication band is Band 71B in the 3GPP standard.

According to a filter device of a fifth aspect of the present disclosure, in the filter device of the first aspect, the first communication band is a first transmit band. The second communication band is a second transmit band. A transmit signal in the first transmit band or a transmit signal in the second transmit band is input to the input unit and is output from the output unit.

According to the filter device described above, it is not necessary to individually include a filter, which handles transmit signals in one of overlapping bands, and a filter, which handles transmit signals in the other band, achieving a filter device having a simple configuration and a radio frequency module including the filter device.

According to a filter device of a sixth aspect of the present disclosure, in the filter device of the first aspect, the first communication band is a first receive band. The second communication band is a second receive band. A receive signal in the first receive band or a receive signal in the second receive band is input to the input unit and is output from the output unit.

According to the filter device described above, it is not necessary to individually include a filter, which handles receive signals in one of overlapping bands, and a filter, which handles receive signals in the other band, achieving a filter device having a simple configuration and a radio frequency module including the filter device.

A filter device of a seventh aspect of the present disclosure is used in a single communication band in which a transmit band in the single communication band includes a first transmit band and a second transmit band and in which a receive band in the single communication band includes a first receive band and a second receive band. The first transmit band and the second transmit band overlap each other. The first receive band and the second receive band overlap each other. The filter device includes an input/output unit, a transmit-signal input unit, a receive-signal output unit, a transmit filter unit, and a receive filter unit. The transmit filter unit is disposed between the transmit-signal input unit and the input/output unit. The transmit filter unit uses, as a pass band, a fixed frequency band including the first transmit band and the second transmit band. The receive filter unit is disposed between the receive-signal output unit and the input/output unit. The receive filter unit uses, as a pass band, a fixed frequency band including the first receive band and the second receive band.

According to the configuration described above, it is not necessary to individually include a duplexer or a multiplexer, which handles transmit signals and receive signals in one of overlapping bands, and a duplexer or a multiplexer, which handles transmit signals and receive signals in the other band, achieving a filter device having a simple configuration and a radio frequency module including the filter device.

According to a radio frequency module of an eighth aspect of the present disclosure, the single communication band is a communication band defined in a 3GPP standard. The first transmit band and the second transmit band are transmit bands defined in the 3GPP standard. The first receive band and the second receive band are receive bands defined in the 3GPP standard.

According to a radio frequency module of a ninth aspect of the present disclosure, the first transmit band is a transmit band of Band 28A defined in the 3GPP standard, and the second transmit band is a transmit band of Band 28B defined in the 3GPP standard. The first receive band is a receive band of Band 28A defined in the 3GPP standard, and the second receive band is a receive band of Band 28B defined in the 3GPP standard.

According to a radio frequency module of a tenth aspect of the present disclosure, the first transmit band is a transmit band of Band 71A defined in the 3GPP standard, and the second transmit band is a transmit band of Band 71B defined in the 3GPP standard. The first receive band is a receive band of Band 71A defined in the 3GPP standard, and the second receive band is a receive band of Band 71B defined in the 3GPP standard.

A radio frequency module of an eleventh aspect of the present disclosure includes the filter device according to the first aspect, an antenna switch that is connected to the filter device, and a matching circuit that is connected between the filter device and the antenna switch and that matches impedance between the filter device and the antenna switch.

According to the configuration described above, it is not necessary to include matching circuits individually for a filter, which handles transmit signals in one of overlapping bands, and a filter, which handles transmit signals in the other band, achieving simplification of the configuration.

According to a radio frequency module of a twelfth aspect of the present disclosure, in the radio frequency module of the eleventh aspect, the matching circuit is a variable matching circuit that switches between a matching state in the first communication band and a matching state in the second communication band.

According to the configuration described above, switching to a corresponding suitable matching state may be made between the state, in which signals in the first communication band are handled, and the state, in which signals in the second communication band are handled. The first communication band overlaps the second communication band.

A radio frequency module of a thirteenth aspect of the present disclosure includes the filter device according to the seventh aspect, an antenna switch that is connected to the input/output unit of the filter device, and a matching circuit that is connected between the filter device and the antenna switch and that matches impedance between the filter device and the antenna switch.

According to the configuration described above, it is not necessary to include matching circuits individually for a duplexer or a multiplexer, which handles transmit signals and receive signals in one of overlapping bands, and a duplexer or a multiplexer, which handles transmit signals and receive signals in the other band, achieving simplification of the configuration.

According to a radio frequency module of a fourteenth aspect of the present disclosure, in the radio frequency module of the thirteenth aspect, the matching circuit is a variable matching circuit that switches between a matching state in the first transmit band and the first receive band and a matching state in the second transmit band and the second receive band.

According to the configuration described above, switching to a corresponding suitable matching state may be made between the matching condition for the state, in which signals in the first transmit band and the first receive band are handled, and the matching condition for the state, in which signals in the second transmit band and the second receive band are handled.

A radio frequency module of a fifteenth aspect of the present disclosure includes the filter device according to the fifth aspect, a transmit-signal amplifying circuit that amplifies a transmit signal, and a matching circuit that is connected between the transmit-signal amplifying circuit and the filter device and that matches impedance between the filter device and the transmit-signal amplifying circuit.

According to the configuration described above, it is not necessary to include matching circuits individually for a filter, which handles transmit signals in one of overlapping bands, and a filter, which handles transmit signals in the other band, achieving simplification of the configuration.

A radio frequency module of a sixteenth aspect of the present disclosure includes the filter device according to the sixth aspect, a receive-signal amplifying circuit that is connected to the filter device, and a matching circuit that is connected between the filter device and the receive-signal amplifying circuit and that matches impedance between the filter device and the receive-signal amplifying circuit.

According to the configuration described above, it is not necessary to include matching circuits individually for a filter, which handles receive signals in one of overlapping bands, and a filter, which handles receive signals in the other band, achieving simplification of the configuration.

A radio frequency module of a seventeenth aspect of the present disclosure includes the filter device according to the seventh aspect, a transmit-signal amplifying circuit, a transmit-signal matching circuit, a receive-signal amplifying circuit, and a receive-signal matching circuit. The transmit-signal amplifying circuit amplifies a transmit signal. The transmit-signal matching circuit is connected between the transmit-signal amplifying circuit and the transmit filter unit and matches impedance between the transmit filter unit and the transmit-signal amplifying circuit. The receive-signal amplifying circuit is connected to the receive filter unit. The receive-signal matching circuit is connected between the receive filter unit and the receive-signal amplifying circuit and matches impedance between the receive filter unit and the receive-signal amplifying circuit.

According to the configuration described above, it is not necessary to include matching circuits individually for a duplexer, which handles transmit signals and receive signals in one of overlapping bands, and a duplexer, which handles transmit signals and receive signals in the other band, achieving simplification of the configuration.

According to a radio frequency module of an eighteenth aspect of the present disclosure, in the radio frequency module of the fifteenth aspect, the matching circuit is a variable matching circuit that switches between a matching state in the first transmit band and a matching state in the second transmit band.

According to the configuration described above, switching to a corresponding suitable matching state may be made between the state, in which transmit signals in one of overlapping bands are handled, and in the state, in which transmit signals in the other band are handled.

According to a radio frequency module of a nineteenth aspect of the present disclosure, in the radio frequency module of the sixteenth aspect, the matching circuit is a variable matching circuit that switches between a matching state in the first receive band and a matching state in the second receive band.

According to the configuration described above, switching to a corresponding suitable matching state may be made between the state, in which receive signals in one of overlapping bands are handled, and the state, in which receive signals in the other band are handled.

According to a radio frequency module of a twentieth aspect of the present disclosure, in the radio frequency module of the seventeenth aspect, the transmit-signal matching circuit is a variable matching circuit that switches between a matching state in the first transmit band and a matching state in the second transmit band. The receive-signal matching circuit is a variable matching circuit that switches between a matching state in the first receive band and a matching state in the second receive band.

According to the configuration described above, switching to a corresponding suitable matching state may be made between the state, in which transmit signals and receive signals in one of overlapping bands are handled, and the state, in which transmit signals and receive signals in the other band are handled.

Referring to figures, multiple embodiments for carrying out the present disclosure will be described below by taking some concrete examples. In the figures, the identical points are designated with the identical reference numbers. In consideration of easiness of description or understanding of points, the embodiments are indicated separately for convenience sake of description. However, partial replacement or combination of the configurations described in different embodiments may be made. In a second embodiment and its subsequent embodiments, points common to those in a first embodiment will not be described, and only different points will be described. In particular, similar effects caused by similar configurations will not be described in each embodiment.

First Embodiment

The first embodiment describes a transmit filter serving as an exemplary filter device provided by the present disclosure, and also describes a radio frequency module including the transmit filter. The first embodiment describes an exemplary filter device that handles signals in the transmit band of "Band 71" which is a single communication band defined in 3GPP.

FIG. 1 is a circuit diagram of a transmit filter 1 according to the first embodiment. The transmit filter 1, which includes one input unit 11 and one output unit 12, is a filter device used in the transmit band of Band 71. For example, the input unit 11 is an input terminal of the transmit filter 1, and the output unit 12 is an output terminal of the transmit filter 1.

Band 71 is a single communication band to which 617 MHz to 698 MHz is assigned. The transmit band of Band 71 includes a first transmit band (Tx in Band 71A which is hereinafter referred to as "71ATx") and a second transmit band (Tx in Band 71B which is hereinafter referred to as "71BTx") which overlap each other. The receive band of Band 71 includes a first receive band (Rx in Band 71A which is hereinafter referred to as "71ARx") and a second receive band (Rx in Band 71B which is hereinafter referred to as "71BRx") which overlap each other.

Not only Band 71 but also Band 71A and Band 71B each are a single communication band defined in 3GPP.

The bands of Band 71 are as follows.

| Frequency Band | Transmit Band [MHz] | Receive Band [MHz] |
|---|---|---|
| Band 71A | 663-688 | 617-642 |
| Band 71B | 673-698 | 627-652 |

The transmit filter 1 illustrated in FIG. 1 is a band pass filter that passes a fixed frequency band from 663 MHz to 698 MHz. The "fixed frequency band" indicates a predetermined pass band of the transmit filter 1.

The transmit filter 1 is a surface acoustic wave (SAW) component. For example, the transmit filter 1 is an acoustic wave filter, which uses Love waves and in which electrodes in a given pattern are formed on the surface of an oxide single crystal substrate of $LiNbO_3$ (lithium niobate: LN) or $LiTaO_3$ (lithium tantalate: LT) and a fabricated film is formed on the surface of the substrate.

Figure 13:
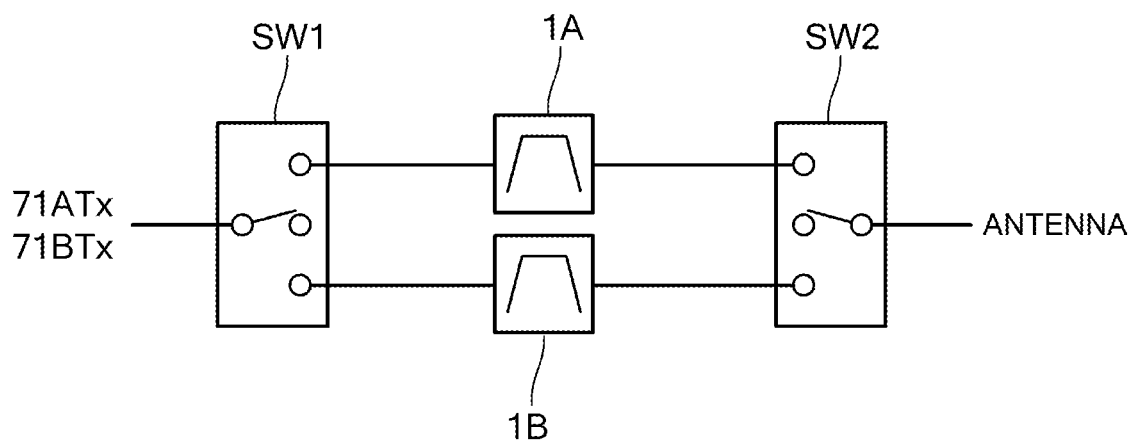
FIG. 13 is a circuit diagram of a filter device according to a comparative example.

FIG. 13 illustrates the configuration of a filter device according to a comparative example. The filter device according to the comparative example includes a filter 1A that passes signals in the transmit band 71ATx, a filter 1B that passes signals in the transmit band 71BTx, and switches SW1 and SW2 that select which one of the two filters 1A and 1B is to be used.

Figure 14:
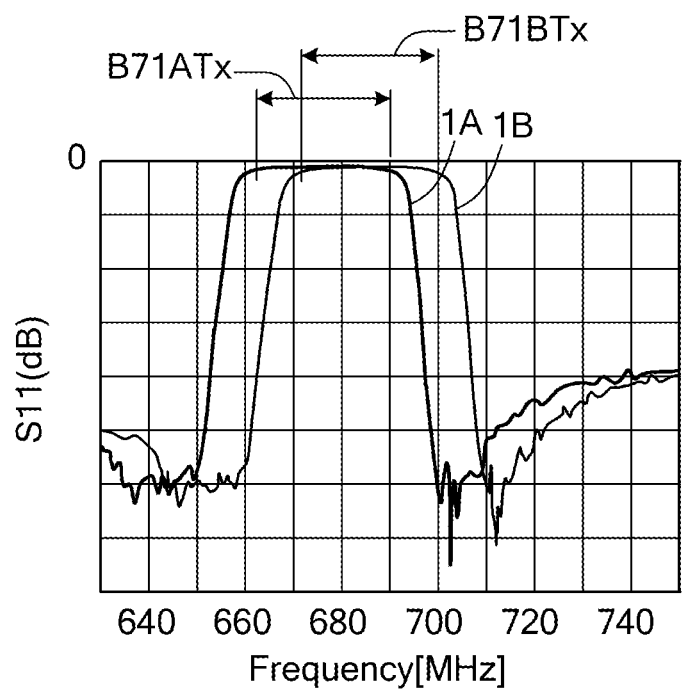
FIG. 14 is a diagram illustrating frequency characteristics of filters.

FIG. 14 is a diagram illustrating frequency characteristics of the filters 1A and 1B. In FIG. 14, the characteristics indicated by "1A" indicate bandpass characteristics of the filter 1A; the characteristics indicated by "1B" indicate bandpass characteristics of the filter 1B. The filter 1A passes the first transmit band 71ATx of Band 71, and the filter 1B passes the second transmit band 71BTx of Band 71.

When signals in the transmit band 71ATx are used in the filter device according to the comparative example, the switches SW1 and SW2 select the filter 1A. When signals in the transmit band 71BTx are used, the switches SW1 and SW2 select the filter 1B.

Figure 2:
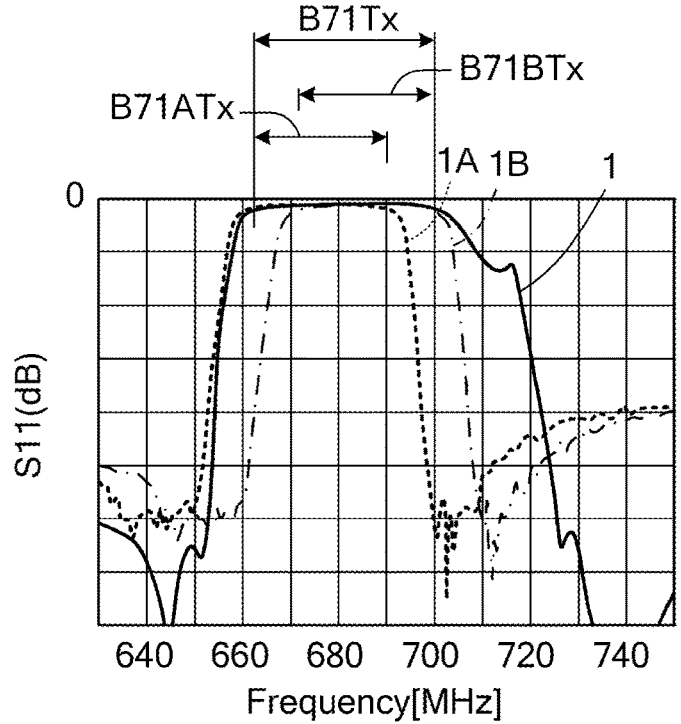
FIG. 2 is a diagram illustrating frequency characteristics of the transmit filter illustrated in FIG. 1.

FIG. 2 is a diagram illustrating frequency characteristics of the transmit filter 1 illustrated in FIG. 1. In FIG. 2, the characteristics indicated by "1" indicate bandpass characteristics of the transmit filter 1. In FIG. 2, the bandpass characteristics of the filters 1A and 1B according to the comparative example are illustrated in an overlapping manner.

The transmit filter 1 according to the first embodiment passes the first transmit band 71ATx and the second transmit band 71BTx of Band 71.

In the transmit filter 1 according to the first embodiment, it is not necessary to individually include a filter, which handles transmit signals in the first transmit band 71ATx, and a filter, which handles transmit signals in the second transmit band 71BTx, achieving a filter device having a simple configuration.

Figure 3:
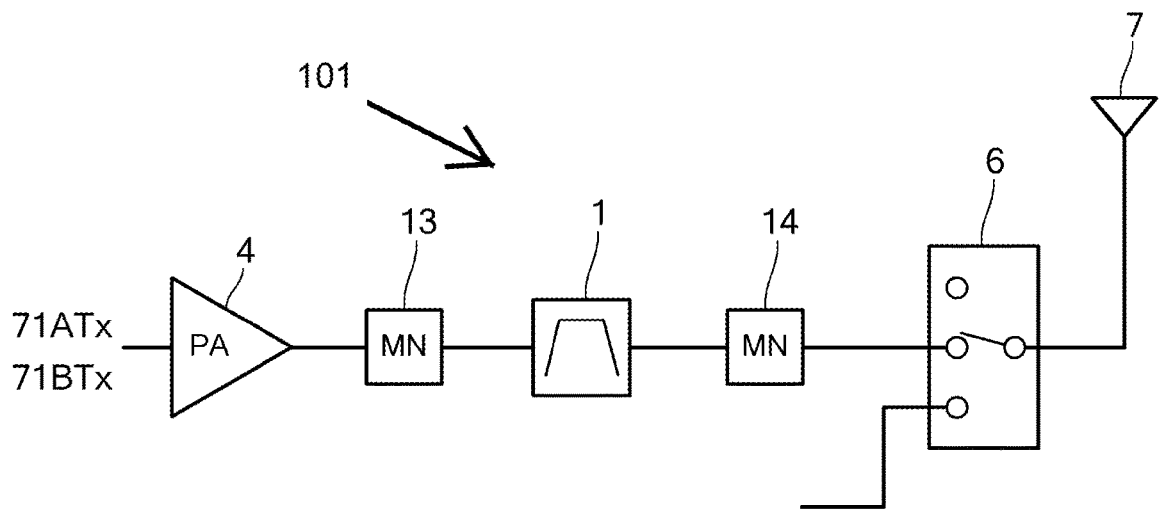
FIG. 3 is a circuit diagram of a radio frequency module according to the first embodiment.

FIG. 3 is a circuit diagram of a radio frequency module according to the first embodiment. A radio frequency module 101 includes the transmit filter 1, an antenna switch 6, and a matching circuit 14. The transmit filter 1 is the transmit filter 1 illustrated in FIG. 1. The antenna switch 6 is a switch that selects a circuit that is to be connected to the antenna 7. The matching circuit 14, which is connected between the transmit filter 1 and the antenna switch 6, matches the impedance between the transmit filter 1 and the antenna switch 6.

The radio frequency module 101 illustrated in FIG. 3 also includes a power amplifier 4 and a matching circuit 13. The power amplifier 4 is a transmit-signal amplifying circuit amplifying a transmit signal. The matching circuit 13, which is connected between the power amplifier 4 and the transmit filter 1, matches the impedance between the transmit filter 1 and the power amplifier 4.

Figure 15:
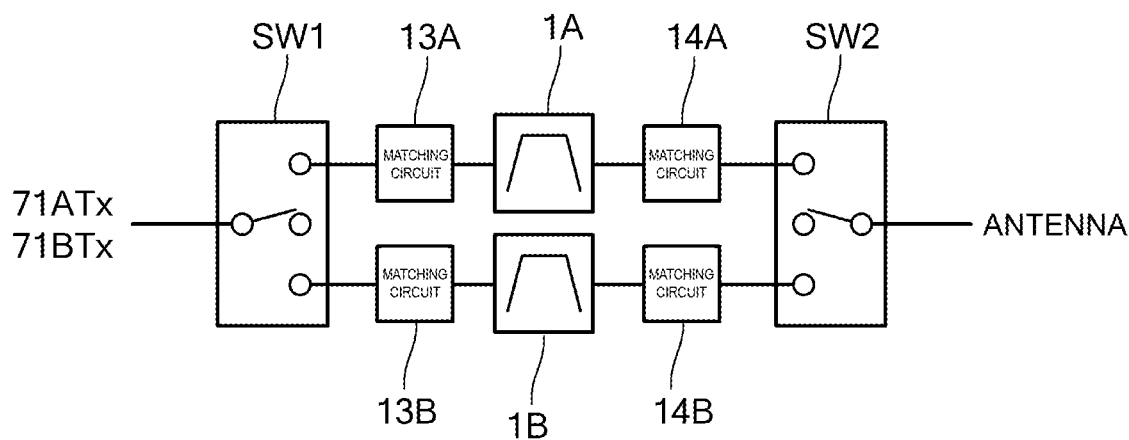
FIG. 15 is a diagram illustrating the configuration of a radio frequency module according to a comparative example.
Figure 16:
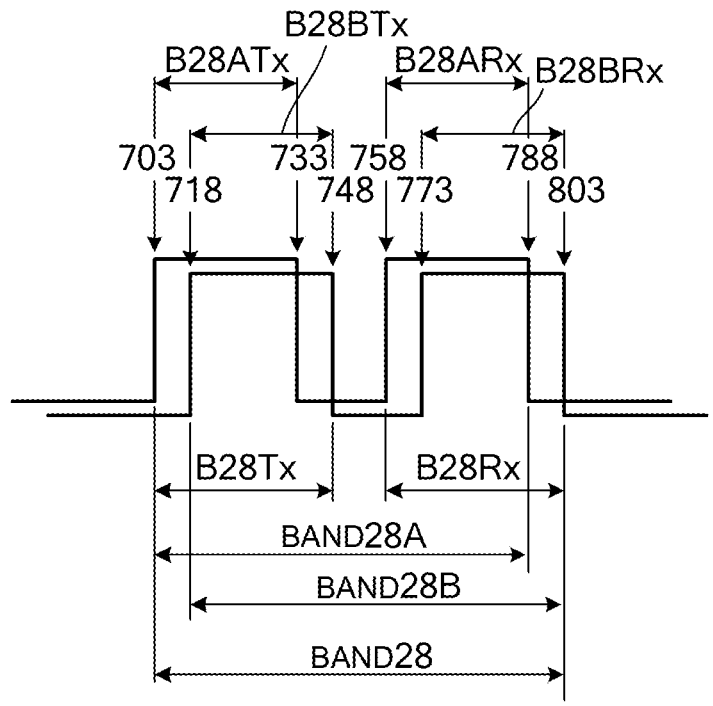
FIG. 16 is a diagram illustrating the frequency bands of Band 28.
Figure 17:
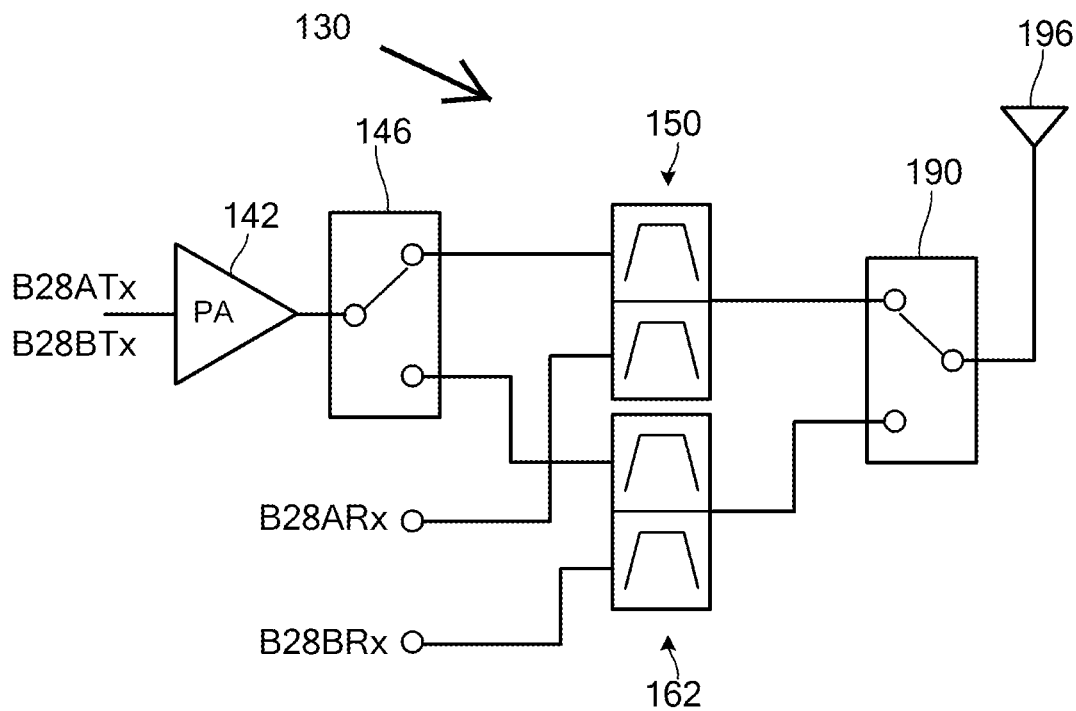
FIG. 17 is a diagram illustrating the configuration of a filter device for transmit/receive signals of Band 28.

FIG. 15 illustrates the configuration of a radio frequency module according to a comparative example. The radio frequency module according to the comparative example includes the filter 1A that passes signals in the transmit band 71ATx, the filter 1B that passes signals in the transmit band 71BTx, and the switches SW1 and SW2 that select which one of the two filters 1A and 1B is to be used. The radio frequency module also includes a matching circuit 13A for impedance matching between the filter 1A and the switch SW1, a matching circuit 13B for impedance matching between the filter 1B and the switch SW1, a matching circuit 14A for impedance matching between the filter 1A and the switch SW2, and a matching circuit 14B for impedance matching between the filter 1B and the switch SW2.

In contrast to the comparative example illustrated in FIG. 15, in the first embodiment, it is not necessary to individually include the matching circuits (13A and 14A) for the filter handling transmit signals in the first transmit band 71ATx and the matching circuits (13B and 14B) for the filter handling transmit signals in the second transmit band 71BTx, achieving a radio frequency module having a simple configuration. For example, the radio frequency module is formed of a small number of components, achieving a reduction in the layout space for components and a reduction in cost.

In the first embodiment, Band 71 defined in 3GPP is described as an exemplary single communication band according to the embodiment of the present disclosure. The present disclosure may be applied similarly to Band 28 defined in 3GPP. That is, in the first embodiment, a transmit filter compatible with Band 71 is described as an example.

The present disclosure may be also applied similarly to a transmit filter compatible with Band 28.

The bands of Band 28 are as follows.

| Frequency Band | Transmit Band [MHz] | Receive Band [MHz] |
| --- | --- | --- |
| Band 28A | 703-733 | 758-788 |
| Band 28B | 718-748 | 773-803 |

Band 28A described above may indicate the A band in Band 28. Similarly, Band 28B may indicate the B band in Band 28.

Not only Band 28 but also Band 28A and Band 28B, each are a single communication band defined in 3GPP.

When the transmit filter 1 is compatible with Band 28, the transmit filter 1 is a band pass filter that passes a fixed frequency band from 703 MHz to 748 MHz.

Also, in the embodiments described below, filter devices compatible with Band 71 defined in 3GPP will be described as examples. The embodiments may be also applied similarly to filter devices compatible with Band 28 defined in 3GPP.

Second Embodiment

The second embodiment describes an exemplary radio frequency module including a transmit filter and variable matching circuits.

Figure 4A:
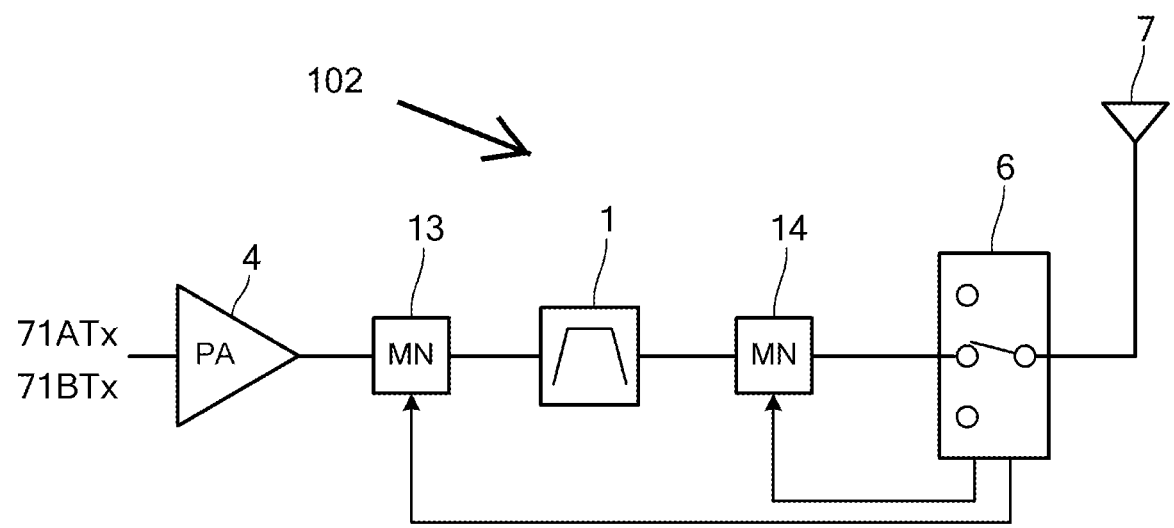
FIG. 4A is a circuit diagram of a radio frequency module according to a second embodiment.
Figure 4B:
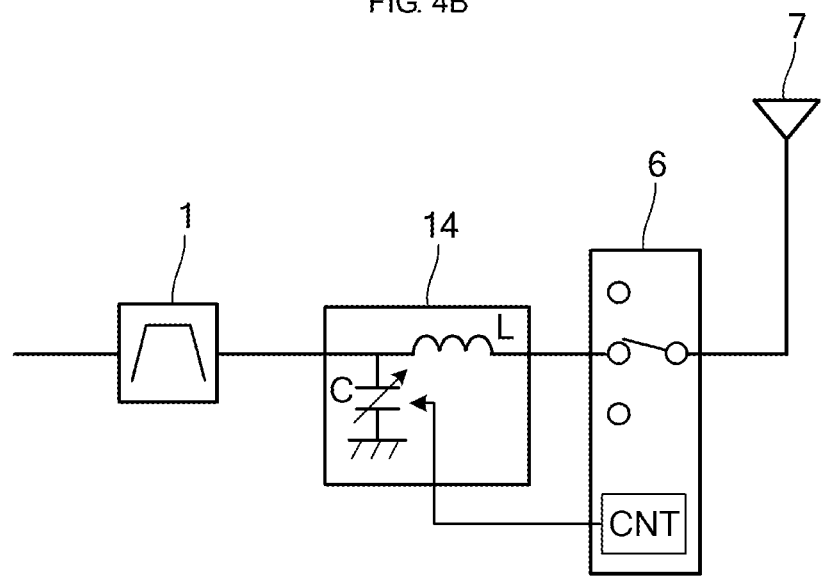
FIG. 4B is a diagram illustrating the configuration of a matching circuit and the relationship between the matching circuit and a control signal.

FIG. 4A is a circuit diagram of a radio frequency module according to the second embodiment. FIG. 4B is a diagram illustrating the configuration of a matching circuit 14 and the relationship between the matching circuit 14 and a control signal. A radio frequency module 102 includes the power amplifier 4, the matching circuit 13, the transmit filter 1, the matching circuit 14, and the antenna switch 6. The matching circuit 13 matches the impedance between the power amplifier 4 and the transmit filter 1, and the matching circuit 14 matches the impedance between the transmit filter 1 and the antenna switch 6. The transmit filter 1 is the same as the transmit filter 1 described in the first embodiment.

Each of the matching circuits 13 and 14 is a variable matching circuit, and the circuit constant of the matching circuit is defined by using a corresponding control signal given from the outside. The antenna switch 6 not only selects a circuit that is to be connected to the antenna 7, but also gives the control signals to the matching circuits 13 and 14.

As illustrated in FIG. 4B, the matching circuit 14 is formed, for example, of reactive devices, such as a variable capacitive device C and an inductor L. The variable capacitive device C is given a control signal from a control circuit CNT in the antenna switch 6 so that the capacitance thereof is determined. Similarly, the matching circuit 13 is formed of reactive devices, such as a variable capacitive device and an inductor, and the variable capacitive device is given a control signal.

Figure 5A:
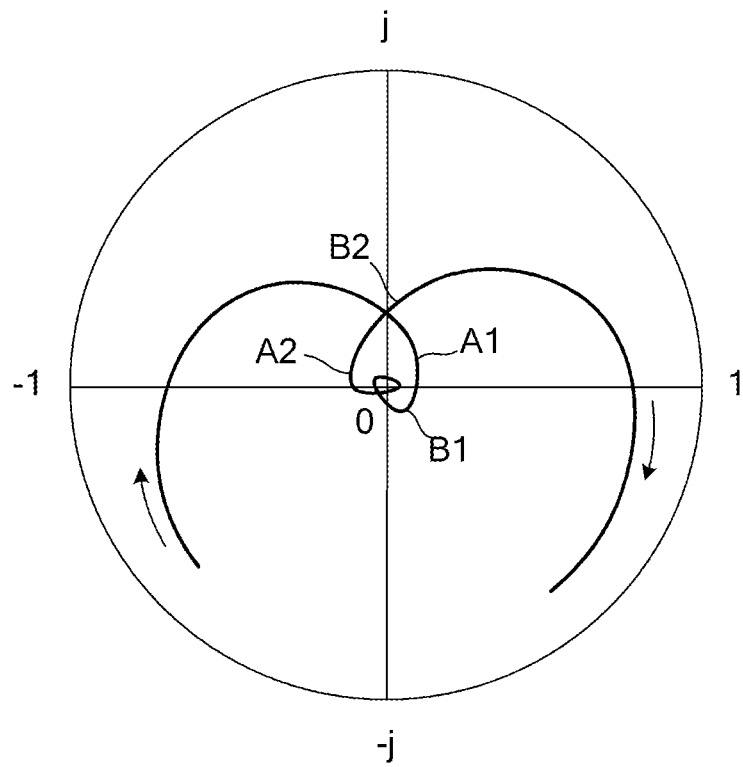
FIGS. 5A and 5B are conceptual diagrams illustrating Smith charts describing the trace of the reflection coefficient, which is obtained in frequency sweeps and which is obtained when the transmit filter side (antenna side) is viewed from the output end of a power amplifier.
Figure 5B:
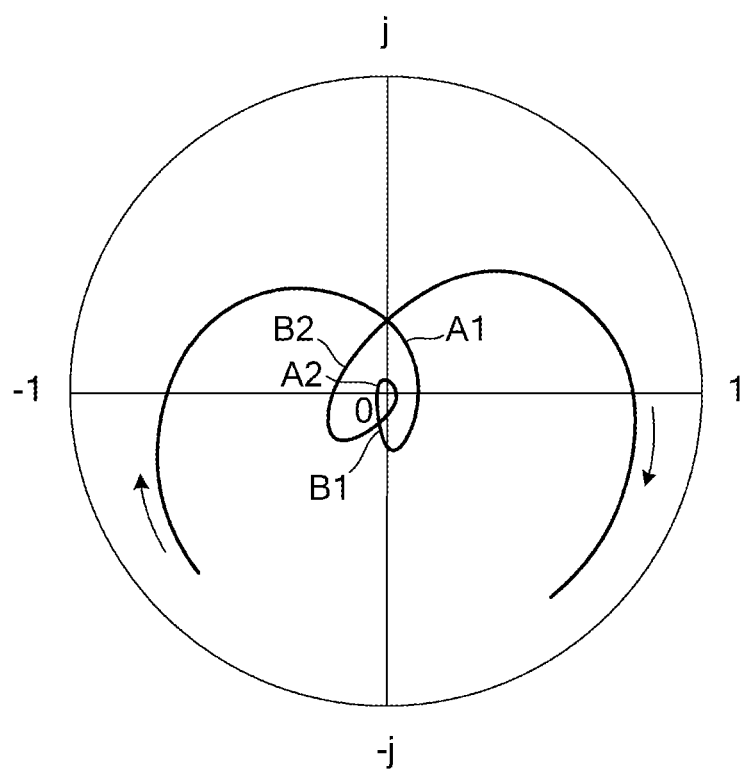

FIGS. 5A and 5B are conceptual diagrams illustrating Smith charts describing the trace of the reflection coefficient, which is obtained in frequency sweeps and which is obtained when the transmit filter 1 side (antenna 7 side) is viewed from the output end of the power amplifier 4. In FIGS. 5A and 5B, the point A1 indicates the lower-limit frequency (663 MHz) of the first transmit band 71ATx. The point A2 indicates the upper-limit frequency (688 MHz) of the first transmit band 71ATx. The point B1 indicates the lower-limit frequency (673 MHz) of the second transmit band 71BTx. The point B2 indicates the upper-limit frequency (698 MHz) of the second transmit band 71BTx.

FIG. 5A illustrates characteristics obtained when a transmit signal in the first transmit band 71ATx is transmitted (that is, when control signals are received so that the matching circuits 13 and 14 illustrated in FIG. 4A are compatible with the first transmit band 71ATx). FIG. 5B illustrates characteristics obtained when a transmit signal in the second transmit band 71BTx is transmitted (that is, when control signals are received so that the matching circuits 13 and 14 illustrated in FIG. 4A are compatible with the second transmit band 71BTx).

FIG. 5A indicates that the reflection coefficient for the upper-limit frequency (point B2) of the second transmit band 71BTx is large and does not satisfy the stipulation. In the state illustrated in FIG. 5A, low reflection characteristics are obtained from the lower-limit frequency (point A1) of the first transmit band 71ATx to the upper-limit frequency (point A2) of the first transmit band 71ATx.

FIG. 5B indicates that the reflection coefficient for the lower-limit frequency (point A1) of the first transmit band 71ATx is large and does not satisfy the stipulation. In the state illustrated in FIG. 5B, low reflection characteristics are obtained from the lower-limit frequency (point B1) of the second transmit band 71BTx to the upper-limit frequency (point B2) of the second transmit band 71BTx.

According to the second embodiment, switching to a corresponding suitable matching state may be made between the state, in which transmit signals in the transmit band (71ATx) which is one of the overlapping bands are handled, and the state, in which transmit signals in the other transmit band (71BTx) are handled.

The control signals for the matching circuits 13 and 14 may be analog signals or may be digital signals. In the case of digital signals, for example, the Mobile Industry Processor Interface (MIPI) standard is used.

Third Embodiment

A third embodiment describes a receive filter serving as an exemplary filter device provided by the present disclosure, and also describes a radio frequency module including the receive filter.

Figure 6:
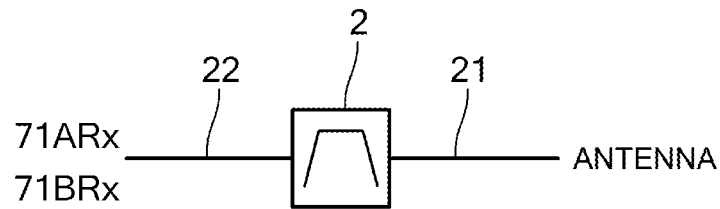
FIG. 6 is a circuit diagram of a receive filter according to a third embodiment.

FIG. 6 is a circuit diagram of a receive filter 2 according to the third embodiment. The receive filter 2 is a filter device which includes one input unit 21 and one output unit 22, and which is used in the receive band of Band 71 defined in 3GPP. As described above, Band 71 has the transmit band (71ATx and 71BTx) and the receive band (71ARx and 71BRx) which are adjacent to each other in the single communication band from 617 MHz to 698 MHz. The first receive band (71ARx) overlaps the second receive band (71BRx).

The receive filter 2 illustrated in FIG. 6 is a band pass filter that passes the frequency band from 617 MHz to 652 MHz. That is, the receive filter 2 according to the third embodiment passes signals in the first receive band 71ARx and the second receive band 71BRx of Band 71.

According to the receive filter 2 in the third embodiment, it is not necessary to individually include a filter, which handles receive signals in the first receive band 71ARx, and a filter, which handles receive signals in the second receive band 71BRx, achieving a filter device having a simple configuration.

Figure 7:
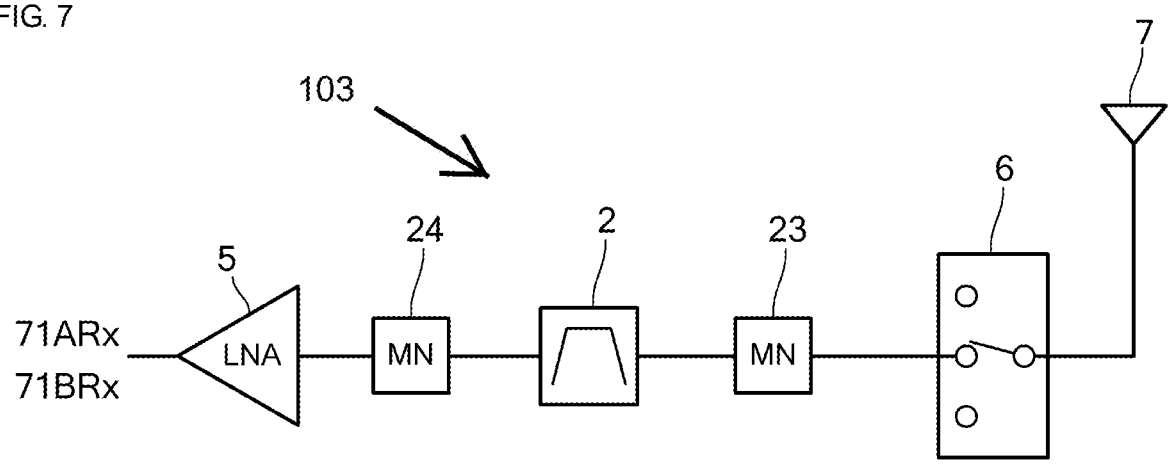
FIG. 7 is a circuit diagram of a radio frequency module according to the third embodiment.

FIG. 7 is a circuit diagram of a radio frequency module according to the third embodiment. A radio frequency module 103 includes the receive filter 2, a matching circuit 24, and a low noise amplifier 5. The receive filter 2 is the receive filter 2 illustrated in FIG. 6. The low noise amplifier 5 is a receive-signal amplifying circuit that amplifies a receive signal. The matching circuit 24, which is connected between the receive filter 2 and the low noise amplifier 5, matches the impedance between the receive filter 2 and the low noise amplifier 5.

The radio frequency module 103 includes the antenna switch 6 and a matching circuit 23. The antenna switch 6 is a switch selecting a circuit that is to be connected to the antenna 7. The matching circuit 23, which is connected between the receive filter 2 and the antenna switch 6, matches the impedance between the receive filter 2 and the antenna switch 6.

In the third embodiment, it is not necessary to individually include a matching circuit for a filter, which handles receive signals in the first receive band 71ARx, and a matching circuit for a filter, which handles receive signals in the second receive band 71BRx, achieving a radio frequency module having a simple configuration. For example, the radio frequency module is formed of a small number of components, achieving a reduction in the layout space for components and a reduction in cost.

Fourth Embodiment

A fourth embodiment describes an exemplary radio frequency module including a receive filter and variable matching circuits.

Figure 8:
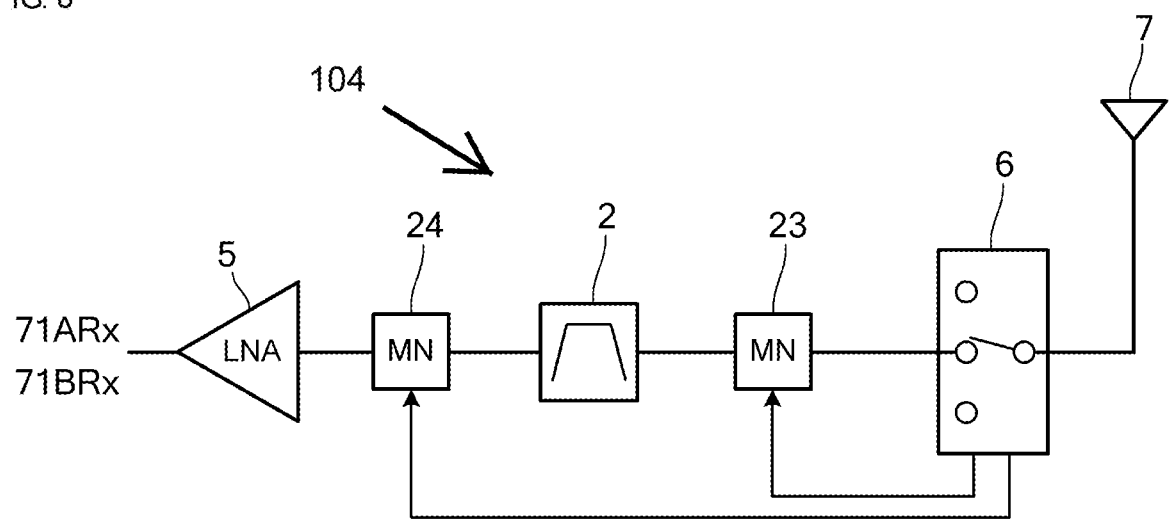
FIG. 8 is a circuit diagram of a radio frequency module according to a fourth embodiment.

FIG. 8 is a circuit diagram of a radio frequency module according to the fourth embodiment. A radio frequency module 104 includes the receive filter 2, the matching circuit 24, and the low noise amplifier 5. The receive filter 2 is the same as the receive filter 2 described in the second embodiment. The low noise amplifier 5 amplifies a receive signal. The matching circuit 24, which is connected between the receive filter 2 and the low noise amplifier 5, matches the impedance between the receive filter 2 and the low noise amplifier 5.

The radio frequency module 104 also includes the antenna switch 6 and the matching circuit 23. The antenna switch 6 is a switch selecting a circuit that is to be connected to the antenna 7. The matching circuit 23, which is connected between the receive filter 2 and the antenna switch 6, matches the impedance between the receive filter 2 and the antenna switch 6.

Each of the matching circuits 23 and 24 is a variable matching circuit, and the circuit constant of the matching circuit is determined by using a corresponding control signal given from the outside. The antenna switch 6 not only selects a circuit that is to be connected to the antenna 7, but also gives the control signals to the matching circuits 23 and 24. That is, the antenna switch 6 switches the circuit constants of the matching circuits 23 and 24 between the state in which receive signals in the receive band (71ARx) are handled and the state in which receive signals in the receive band (71BRx) are handled. Similarly to the example illustrated in FIG. 4B and the like, each of the matching circuits 23 and 24 is formed of reactive devices, such as a variable capacitive device and an inductor, and the variable capacitive device is given a corresponding control signal.

Similarly to the filter device including the variable matching circuits at the input/output units of the transmit filter illustrated in FIG. 4A, the fourth embodiment enables switching to a corresponding suitable matching state to be made between the state, in which receive signals in the receive band (71ARx) which is one of the receive overlapping bands are handled, and the state, in which receive signals in the receive band (71BRx) which is the other receive band are handled.

Fifth Embodiment

A fifth embodiment describes an exemplary duplexer including a transmit filter unit and a receive filter unit, and also describes an exemplary radio frequency module including the duplexer.

Figure 9:
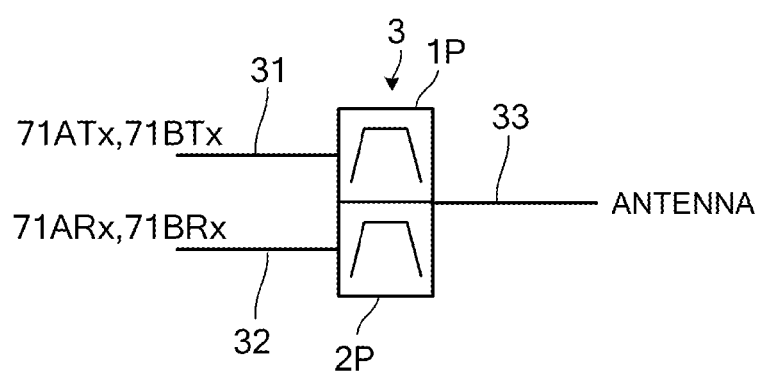
FIG. 9 is a circuit diagram of a duplexer according to a fifth embodiment.

FIG. 9 is a circuit diagram of a duplexer 3 according to the fifth embodiment. The duplexer 3 includes a transmit filter unit 1P and a receive filter unit 2P. The transmit filter unit 1P is disposed between a transmit-signal input unit 31 and an input/output unit 33, and the pass band thereof is a fixed frequency band including the first transmit band (71ATx) and the second transmit band (71BTx). The receive filter unit 2P is disposed between a receive-signal output unit 32 and the input/output unit 33, and the pass band thereof is a fixed frequency band including the first receive band (71ARx) and the second receive band (71BRx). The configuration of the transmit filter unit 1P is the same as the configuration of the transmit filter 1 described in the first embodiment. The configuration of the receive filter unit 2P is the same as the configuration of the receive filter 2 described in the third embodiment.

According to the configuration, it is not necessary to individually include a duplexer, which handles transmit signals (71ATx) and receive signals (71ARx) in one of the overlapping bands, and a duplexer, which handles transmit signals (71BTx) and receive signals (71BRx) in the other band, achieving a filter device (duplexer) having a simple configuration.

Figure 10:
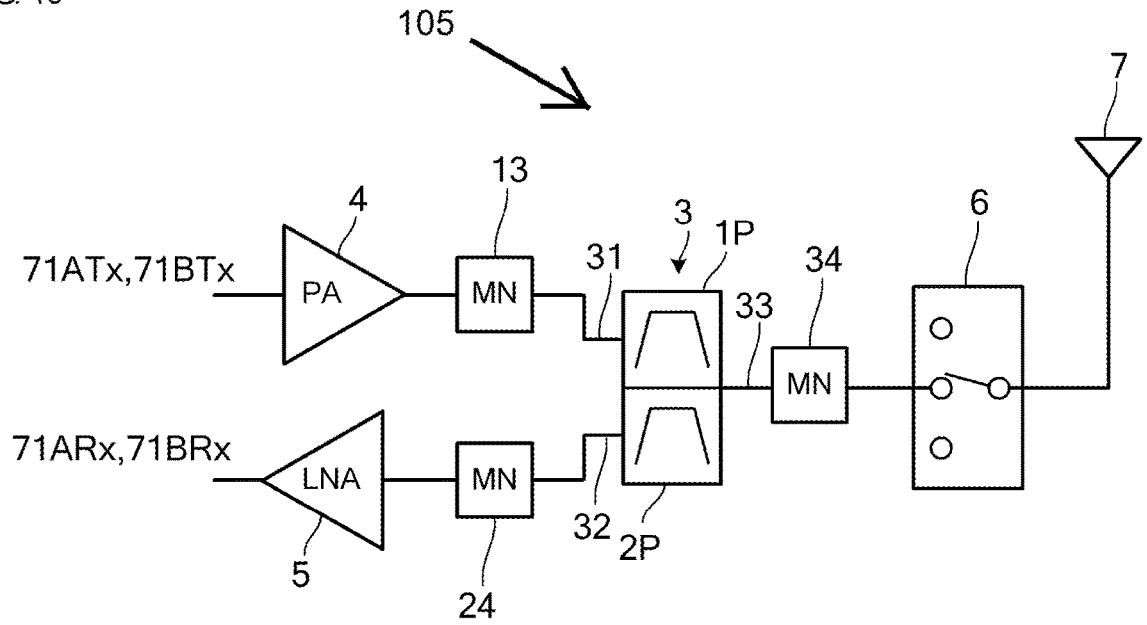
FIG. 10 is a circuit diagram of a radio frequency module according to the fifth embodiment.

FIG. 10 is a circuit diagram of a radio frequency module according to the fifth embodiment. A radio frequency module 105 includes the duplexer 3, the antenna switch 6, and a matching circuit 34. The duplexer 3 is the duplexer 3 illustrated in FIG. 9. The antenna switch 6 is a switch selecting a circuit that is to be connected to the antenna 7. The matching circuit 34, which is connected between the duplexer 3 and the antenna switch 6, matches the impedance between the duplexer 3 and the antenna switch 6.

The radio frequency module 105 includes the power amplifier 4, the low noise amplifier 5, and the matching circuits 13 and 24. The power amplifier 4 is a transmit-signal amplifying circuit that amplifies a transmit signal. The matching circuit 13, which is connected between the power amplifier 4 and the transmit filter unit 1P of the duplexer 3, matches the impedance between the transmit filter unit 1P and the power amplifier 4. The low noise amplifier 5 amplifies a receive signal. The matching circuit 24, which is connected between the receive filter unit 2P of the duplexer 3 and the low noise amplifier 5, matches the impedance between the receive filter unit 2P and the low noise amplifier 5.

In the fifth embodiment, it is not necessary to individually include a matching circuit for a filter, which handles transmit signals in the first transmit band 71ATx, and a matching circuit for a filter, which handles transmit signals in the second transmit band 71BTx, achieving a radio frequency module having a simple configuration. In the fifth embodiment, it is not necessary to individually include a matching circuit for a filter, which handles receive signals in the first receive band 71ARx, and a matching circuit for a filter, which handles transmit signals in the second receive band 71BRx, achieving a radio frequency module having a simple configuration. Further, in the fifth embodiment, it is not necessary to individually dispose, between a duplexer and an antenna switch, a filter, which handles transmit signals in the first transmit band 71ATx and receive signals in the first receive band 71ARx, and a filter, which handles transmit signals in the second transmit band 71BTx and receive signals in the second receive band 71BRx, achieving a radio frequency module having a simple configuration. For example, the radio frequency module is formed of a small number of components, achieving a reduction in the layout space for components and a reduction in cost.

Sixth Embodiment

A sixth embodiment describes an exemplary radio frequency module including a duplexer and variable matching circuits.

Figure 11:
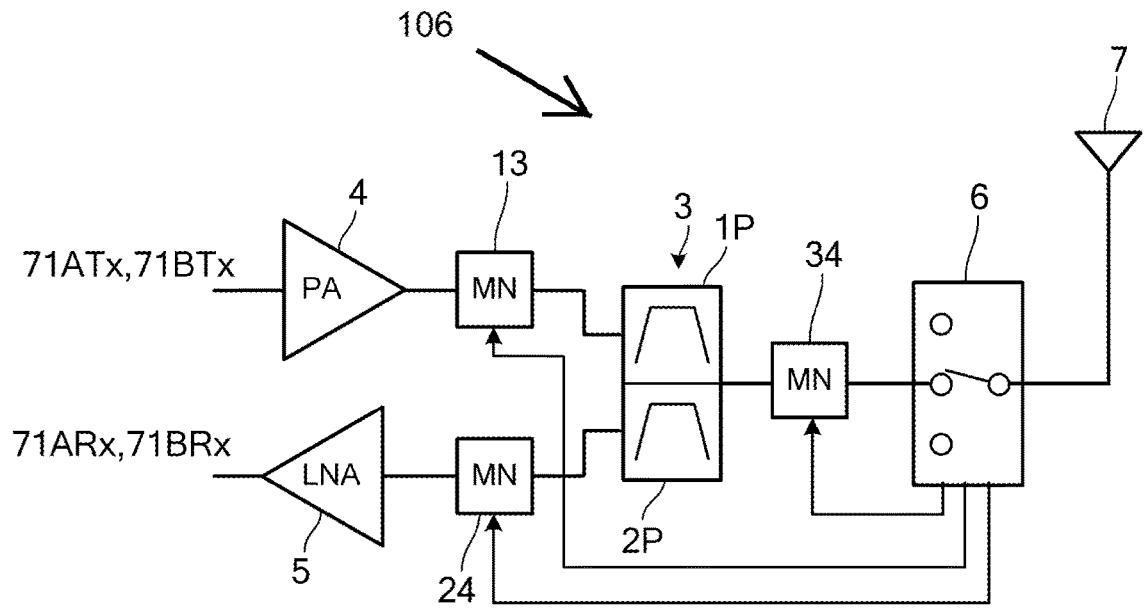
FIG. 11 is a circuit diagram of a radio frequency module according to a sixth embodiment.

FIG. 11 is a circuit diagram of a radio frequency module according to the sixth embodiment. A radio frequency module 106 includes the duplexer 3, the antenna switch 6, and the matching circuit 34. The duplexer 3 is the same as the duplexer 3 described in the fifth embodiment. The antenna switch 6 is a switch selecting a circuit that is to be connected to the antenna 7. The matching circuit 34, which is connected between the duplexer 3 and the antenna switch 6, matches the impedance between the duplexer 3 and the antenna switch 6.

The radio frequency module 106 also includes the power amplifier 4, the low noise amplifier 5, and the matching circuits 13 and 24. The power amplifier 4 is a transmit-signal amplifying circuit that amplifies a transmit signal. The matching circuit 13, which is connected between the power amplifier 4 and the transmit filter unit 1P, matches the impedance between the transmit filter unit 1P and the power amplifier 4. The low noise amplifier 5 amplifies a receive signal. The matching circuit 24, which is connected between the receive filter unit 2P and the low noise amplifier 5, matches the impedance between the receive filter unit 2P and the low noise amplifier 5.

The matching circuit 34 is a variable matching circuit, and the circuit constant of the matching circuit is determined by using a control signal given from the outside. The antenna switch 6 not only selects a circuit that is to be connected to the antenna 7, but also gives the control signal to the matching circuit 34. That is, the matching state of the matching circuit 34 is optimized in the state, in which transmit signals in the first transmit band 71ATx and receive signals in the first receive band 71ARx are handled, and in the state, in which transmit signals in the second transmit band 71BTx and receive signals in the second receive band 71BRx are handled.

Each of the matching circuits 13 and 24 is a variable matching circuit, and the circuit constant of each of the matching circuits 13 and 24 is determined by using a corresponding control signal given from the outside. The antenna switch 6 gives the control signals to the matching circuits 13 and 24. That is, the matching state of the matching circuit 13 is optimized in the state, in which transmit signals in the first transmit band 71ATx are handled, and the state, in which transmit signals in the second transmit band 71BTx are handled. Similarly, the matching state of the matching circuit 24 is optimized in the state, in which receive signals in the first receive band 71ARx are handled, and the state, in which receive signals in the second receive band 71BRx are handled.

Seventh Embodiment

A seventh embodiment describes an exemplary radio frequency module including a multiplexer. The fifth and sixth embodiments, each describe the radio frequency module including a duplexer. Similarly, a radio frequency module including a multiplexer having three or more filters may be formed.

Figure 12:
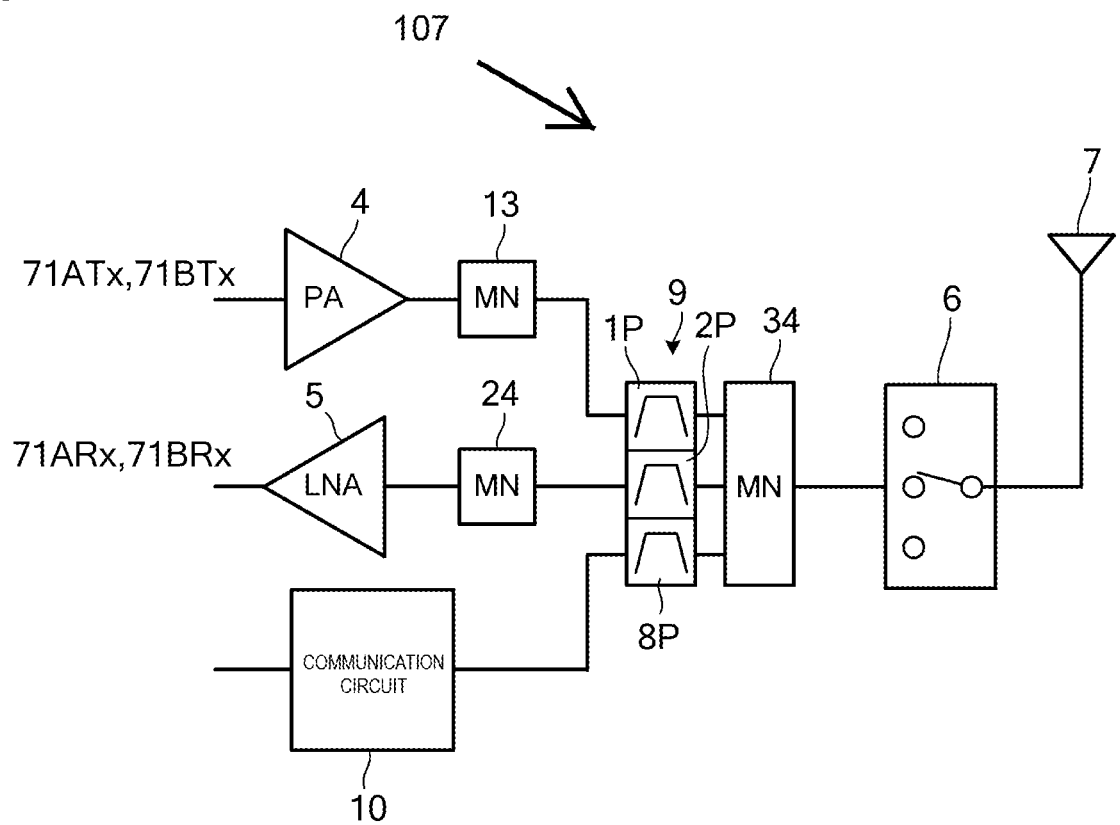
FIG. 12 is a circuit diagram of a radio frequency module according to a seventh embodiment.

FIG. 12 is a circuit diagram of a radio frequency module 107 according to the seventh embodiment. The radio frequency module 107 includes a multiplexer 9, the antenna switch 6, and the matching circuit 34. The multiplexer 9 includes the transmit filter unit 1P, the receive filter unit 2P, and a band pass filter unit 8P for a communication band different from Band 71. The antenna switch 6 is a switch selecting a circuit that is to be connected to the antenna 7. The matching circuit 34, which is connected between the multiplexer 9 and the antenna switch 6, matches the impedance between the multiplexer 9 and the antenna switch 6.

The radio frequency module 107 also includes the power amplifier 4, the low noise amplifier 5, the matching circuits 13 and 24, and a communication circuit 10 for a different band. The power amplifier 4 is a transmit-signal amplifying circuit that amplifies a transmit signal. The matching circuit 13, which is connected between the power amplifier 4 and the transmit filter unit 1P, matches the impedance between the transmit filter unit 1P and the power amplifier 4. The low noise amplifier 5 amplifies a receive signal. The matching circuit 24, which is connected between the receive filter unit 2P and the low noise amplifier 5, matches the impedance between the receive filter unit 2P and the low noise amplifier 5.

The communication circuit 10 is a circuit which handles transmit signals and receive signals in a communication band different from Band 71. The communication circuit 10 is formed, for example, of a duplexer, a power amplifier, a low noise amplifying circuit, and a matching circuit.

The radio frequency module including the multiplexer 9 described above may also have a configuration in which the matching circuits 13, 24, and 34 and the like are variable matching circuits so that their matching states are optimized in accordance with the working frequency band.

The above description about the embodiments is exemplary in all respects and is not limiting. Those skilled in the art may modify and change the embodiments appropriately. The scope of the present disclosure is indicated, not by the embodiments described above, but by the claim. The scope of the present disclosure encompasses a change from embodiments which is made within the claim and its equivalent scope.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module comprising:
a filter device used in a single communication band, the single communication band having a first band and a second band, the first band and the second band overlapping each other within the single communication band, the filter device comprising:
a single input terminal; and
a single output terminal,
wherein a pass band of the filter device is a fixed frequency band including the first band and the second band;
a matching circuit connected between the single input terminal and the filter device or between the single output terminal and the filter device, the matching circuit being configured to switch between a first matching impedance when transmitting signals through the first band and a second matching impedance when transmitting signals through the second band, the first band and the second band overlapping each other; and
an antenna switch connected to the single input terminal or the single output terminal of the filter device, the antenna switch configured to select a circuit to be connected to an antenna, and to provide a control signal to the matching circuit to switch between the first matching impedance and the second matching impedance.

2. The radio frequency module according to claim 1, wherein the single communication band is a communication band defined in a 3GPP standard, and
wherein the first band and the second band are communication bands defined in the 3GPP standard.

3. The radio frequency module according to claim 2, wherein the first band is Band 28A in the 3GPP standard, and
wherein the second band is Band 28B in the 3GPP standard.

4. The radio frequency module according to claim 2, wherein the first band is Band 71A in the 3GPP standard, and
wherein the second band is Band 71B in the 3GPP standard.

5. The radio frequency module according to claim 1, wherein the first band is a first transmit band,
wherein the second band is a second transmit band, and
wherein a transmit signal in the first transmit band or a transmit signal in the second transmit band is input to the single input terminal and is output from the single output terminal.

6. The radio frequency module according to claim 5, further comprising:
a transmit-signal amplifying circuit configured to amplify a transmit signal,
wherein the matching circuit is connected between the transmit-signal amplifying circuit and the filter device, and is configured to match an impedance between the filter device and the transmit-signal amplifying circuit.

7. The radio frequency module according to claim 1, wherein the first band is a first receive band,
wherein the second band is a second receive band, and
wherein a receive signal in the first receive band or a receive signal in the second receive band is input to the input terminal and is output from the output terminal.

8. The radio frequency module according to claim 7, further comprising:
a receive-signal amplifying circuit that is connected to the filter device,
wherein the matching circuit is connected between the filter device and the receive-signal amplifying circuit, and is configured to match an impedance between the filter device and the receive-signal amplifying circuit.

9. The radio frequency module according to claim 1, wherein the matching circuit is connected between the filter device and the antenna switch, and is configured to match an impedance between the filter device and the antenna switch.

10. A radio frequency module comprising:
a filter device used in a single communication band, a transmit band in the single communication band including a first transmit band and a second transmit band, a receive band in the single communication band including a first receive band and a second receive band, the first transmit band and the second transmit band overlapping each other, and the first receive band and the second receive band overlapping each other, the filter device comprising:
an input/output terminal;
a transmit-signal input terminal;
a receive-signal output terminal;
a transmit filter that is disposed between the transmit-signal input terminal and the input/output terminal, wherein a pass band of the transmit filter is a fixed frequency band including the first transmit band and the second transmit band; and
a receive filter that is disposed between the receive-signal output terminal and the input/output terminal, wherein a pass band of the receive filter is a fixed frequency band including the first receive band and the second receive band;
a matching circuit connected to the transmit filter or the receive filter, the matching circuit being configured to switch between a first matching impedance when transmitting signals through the first transmit band and when receiving signals through the first receive band, or a second matching impedance when transmitting signals through the second transmit band and when receiving signals through the second receive band; and
an antenna switch connected to the input/output terminal of the filter device, configured to select a circuit to be connected to an antenna and to provide a control signal to the matching circuit to switch between the first matching impedance and the second matching impedance.

11. The radio frequency module according to claim 10, wherein the single communication band is a communication band defined in a 3GPP standard,
wherein the first transmit band and the second transmit band are transmit bands defined in the 3GPP standard, and
wherein the first receive band and the second receive band are receive bands defined in the 3GPP standard.

12. The radio frequency module according to claim 11, wherein the first transmit band is a transmit band of Band 28A defined in the 3GPP standard, and the second transmit band is a transmit band of Band 28B defined in the 3GPP standard, and
wherein the first receive band is a receive band of Band 28A defined in the 3GPP standard, and the second receive band is a receive band of Band 28B defined in the 3GPP standard.

13. The radio frequency module according to claim 11, wherein the first transmit band is a transmit band of Band 71A defined in the 3GPP standard, and the second transmit band is a transmit band of Band 71B defined in the 3GPP standard, and
wherein the first receive band is a receive band of Band 71A defined in the 3GPP standard, and the second receive band is a receive band of Band 71B defined in the 3GPP standard.

14. The radio frequency module according to claim 10, wherein the matching circuit is connected between the filter device and the antenna switch, and is configured to match an impedance between the filter device and the antenna switch.

15. The radio frequency module according to claim 10, further comprising:
a transmit-signal amplifying circuit configured to amplify a transmit signal; and
a receive-signal amplifying circuit configured to amplify a receive signal,
wherein the matching circuit comprises:
a transmit-signal matching circuit that is connected between the transmit-signal amplifying circuit and the transmit filter, and that is configured to match an impedance between the transmit filter and the transmit-signal amplifying circuit;
a receive-signal matching circuit that is connected between the receive filter and the receive-signal amplifying circuit, and that is configured to match an impedance between the receive filter and the receive-signal amplifying circuit.

16. The radio frequency module according to claim 15, wherein the transmit-signal matching circuit is a variable matching circuit configured to switch between a matching state for signals in the first transmit band and a matching state for signals in the second transmit band, and
wherein the receive-signal matching circuit is a variable matching circuit configured to switch between a matching state for signals in the first receive band and a matching state for signals in the second receive band.

* * * * *